(12) United States Patent
Warren (10) Patent No.: US 7,489,724 B2
(45) Date of Patent: Feb. 10, 2009

(54) SYSTEM AND METHOD FOR CONNECTING A HOST AND A TARGET (75) Inventor: Robert Geoffrey Warren, Bristol (GB)

(73) Assignee: STMicroelectronics Limited, Bristol (GB)

( * ) Notice: Subject to any disclaimer, the term of this patent is extended or adjusted under 35 U.S.C. 154(b) by 1119 days.

(21) Appl. No.: 10/247,263

(22) Filed: Sep. 18, 2002

(65) Prior Publication Data

US 2003/0068000 A1  Apr. 10, 2003

(30) Foreign Application Priority Data

Sep. 18, 2001   (EP)   ................................. 01307925

(51) Int. Cl.
*H04B 1/38* (2006.01)
(52) U.S. Cl. .................. 375/221; 375/259; 375/355
(58) Field of Classification Search ................ 375/355, 375/360, 347, 219, 220, 221, 224, 257, 259, 375/354, 358; 713/400, 401, 601
See application file for complete search history.

(56) References Cited

U.S. PATENT DOCUMENTS

| 3,938,086 | A | | 2/1976 | Valbonesi ............ 340/146.1 D |
|---|---|---|---|---|
| 3,974,333 | A | * | 8/1976 | May et al. ................... 375/357 |
| 5,285,482 | A | * | 2/1994 | Sehier et al. ................ 375/355 |
| 5,529,068 | A | * | 6/1996 | Hoenninger et al. ........ 600/413 |
| 5,539,784 | A | * | 7/1996 | Brauns et al. ............... 327/144 |
| 5,587,709 | A | * | 12/1996 | Jeong .......................... 341/100 |
| 5,689,533 | A | | 11/1997 | Brauns et al. ............... 375/360 |
| 6,047,021 | A | * | 4/2000 | Grimes et al. ............... 375/355 |
| 6,154,509 | A | * | 11/2000 | Bishop ........................ 375/371 |
| 6,381,721 | B1 | * | 4/2002 | Warren ........................ 714/727 |
| 6,463,092 | B1 | * | 10/2002 | Kim et al. .................... 375/219 |
| 6,526,535 | B1 | | 2/2003 | Warren ........................ 714/727 |
| 6,553,087 | B1 | * | 4/2003 | Alelyunas et al. ............ 375/357 |
| 6,704,882 | B2 | * | 3/2004 | Zabinski et al. .............. 713/401 |
| 6,714,612 | B1 | * | 3/2004 | Chaudry ...................... 375/368 |
| 6,895,062 | B1 | * | 5/2005 | Wilson ........................ 375/355 |
| 6,907,096 | B1 | * | 6/2005 | Lueker et al. ................ 375/355 |

(Continued)

FOREIGN PATENT DOCUMENTS

EP   0 840 134   5/1998

(Continued)

OTHER PUBLICATIONS

Sweeney, J., "JTAG Boundary Scan: Diagnosing Module Level Functional Failures," in *Proceedings of the National Communications Forum*, Chicago, Illinois, vol. 42, No. 2, pp. 1801-1804, Sep. 30, 1988, XP 000053960.

(Continued)

*Primary Examiner*—Betsy L Deppe
(74) *Attorney, Agent, or Firm*—Lisa Jorgenson; Timothy L. Boller; Seed IP Law Group PLLC (57) ABSTRACT

A system for controlling communications between a host and a target, the system having a data input for receiving a data signal, a clock input for receiving a clock signal, an oversampling circuit for sampling a received data signal and generating a control signal to control processing of the received data signal based at least in part on samples of the received data signal.

38 Claims, 9 Drawing Sheets

U.S. PATENT DOCUMENTS

2002/0027964 A1 * 3/2002 Yoo et al. .................. 375/341

FOREIGN PATENT DOCUMENTS

| EP | 0 840 218 | | 5/1998 |
| EP | 1 058 121 | A1 | 12/2000 |
| WO | WO 95/01021 | | 1/1995 |

OTHER PUBLICATIONS

Grosslight, J., "Oversampling Pushes Logic-Analyzer Resolution to New Highs," *Electronic Design, Test & Measurement Special Editorial Feature*, 41(13):99-100, 102, 104, 106, and 108, Jun. 24, 1993, XP 000378459.

* cited by examiner

SYSTEM AND METHOD FOR CONNECTING A HOST AND A TARGET

BACKGROUND OF THE INVENTION

1. Field of the Invention

The present invention relates to a system comprising a host, a target and connection means therebetween. In particular, but not exclusively, one of the host and target may be an integrated circuit and the other of the host and target may be external to the integrated circuit.

2. Description of the Related Art

Figures 1, 2:
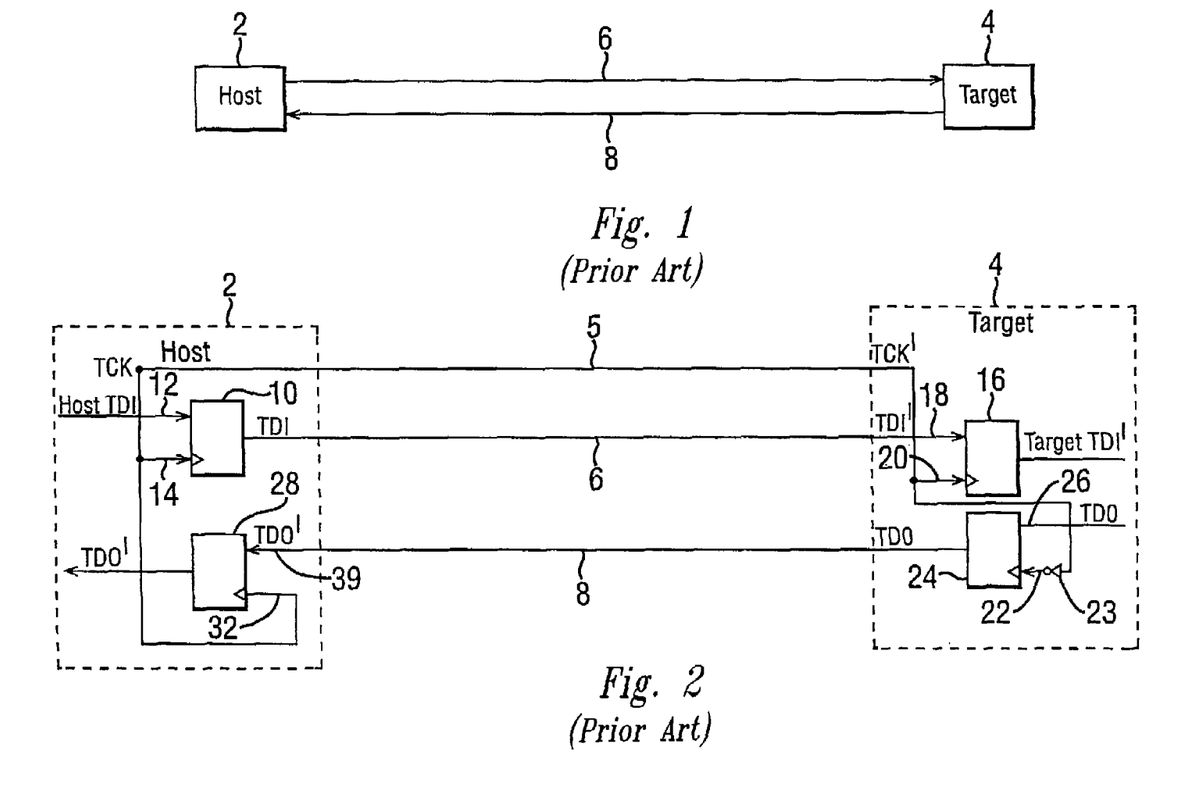
FIG. 1 schematically shows the connection between a host and a target.
FIG. 2 shows in more detail the host and target and the connections therebetween.

Reference is made to FIG. 1 which shows a host 2 and a target 4. The host 2 sends data to the target 4 via a connection line 6. Likewise, the target sends data to the host via a connection line 8. The target comprises a test access port (TAP) controller on an integrated circuit and the host is an off-chip counterpart to the TAP controller. One problem is that a significant length of cable, for example of the order of 0.5 meters may be provided between the host and the target. In addition, the connection between the host and the target may include signal conditioning logic such as buffers, line drivers, signal voltage level converters or the like. This means that this signal conditioning logic adds a path delay for each signal transition both for signals from the host 2 to the target 4 and from the target 4 to the host 2.

Figure 3:
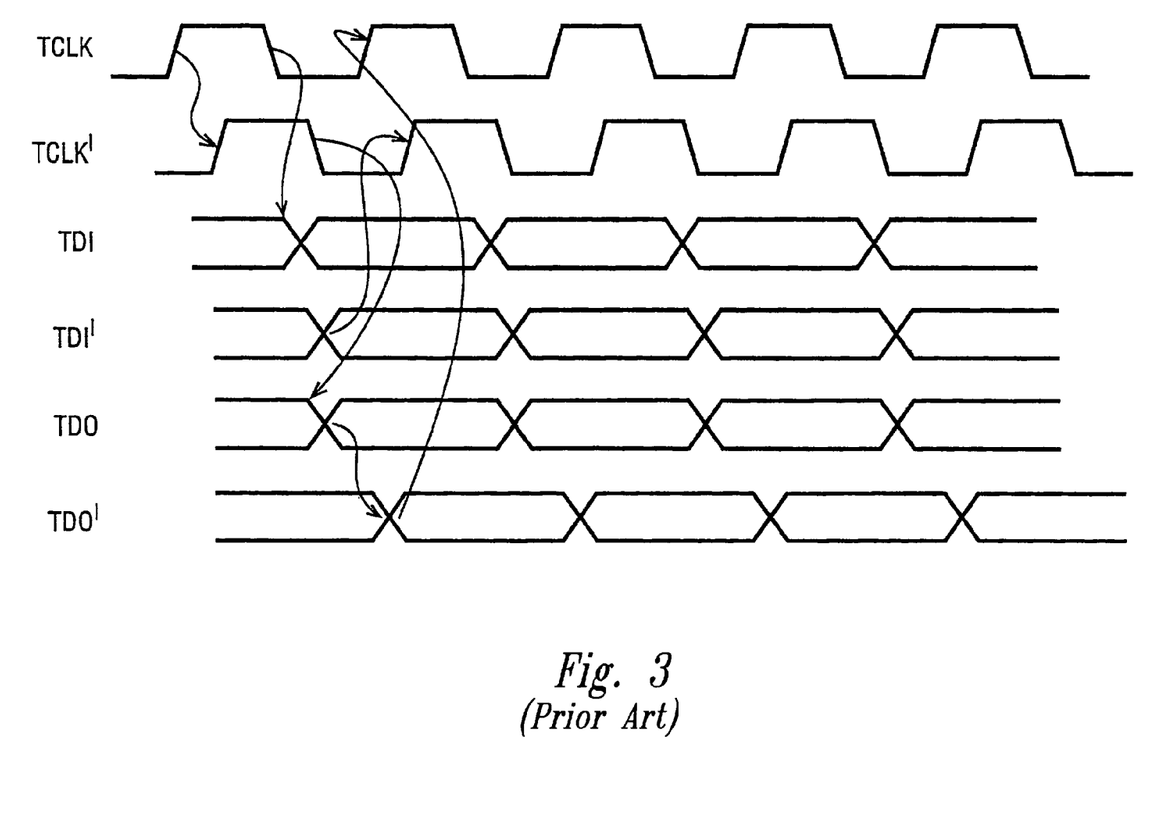
FIG. 3 shows a timing diagram for the signals between the host and target of FIG. 2.

Reference is now made to FIGS. 2 and 3 which illustrate in more detail the problems which can be caused by this delay. The host 2 has a first flip flop 10. This flip flop 10 receives two inputs 12 and 14. The first input 12 is a test data input TDI and comprises the data which is to be transmitted to the target 4. The second input 14 is a clock signal TCK which controls the clocking out of the test data TDI. The clock signal TCK is also transmitted to the target 4 via a separate connection or transmission path 5.

At the target 4, there is a flip flop 16 which receives the received test data TDI' from the host 2 at one input 18 and the received clock signal TCK' at a second input 20. The received test data TDI' is the same as the test data transmitted by the host 2 but with a delay resulting from the transmission of the data across the transmission path 6. The received clock signal TCK' is likewise the same as the clock signal TCK transmitted by the host 2 but with a delay resulting form the transmission of the clock signal across the transmission path 5. The received test data TDI' is thus clocked in using the received clock signal TCK'.

The received clock signal TCK' provides an input 22 to a second flip flop 24. The received clock signal TCK' is first passed through an inverter 23. A second input to the flip flop 24 is provided by a test data output TDO signal which comprises the data which is to be transmitted to the host. Accordingly, the received clock signal TCK' in the form of its inverse, at the target 4, is also used to clock the data out to the host 2.

The host has a second flip flop 28 which receives the test data TDO' from the target 4 and also the clock signal TCK generated by the host 2 via input 32. The received test data TDO' is the same as the transmitted test data TDO but with a delay resulting from the transmission of the test data across path 8. The test data TDO' received from the target 4 is thus clocked out with the clock signal TCK generated by the host 2.

FIG. 3 shows the timing of the various signals. The first signal TCK represents the clock signal timing at the host 2. The second signal TCK' represents the clock signal timing at the target 4, the difference in timing between the two signals being due to the delay path between the host 2 and the target 4. TDI represents the timing of the data transmitted from the host 2 whilst TDI' represents the timing of the data received at the target 4. The test data TDI transmitted by the host 2 is clocked out by the host clock signal TCK whilst the test data TDI' received at the target 4 is clocked in by the received clock signal TCK'. The received clock signal TCK' at the target 4 is also used to clock out the test data TDO which is transmitted from the target 4 to the host 2. However, the problem arises at the host 2 where the data TDO' received from the target 4 is clocked in using the original clock signal TCK. If the data TDO' transmitted from the target 4 is captured by the original clock signal TCK close to when that data is changing, the storage element capturing the data at the host 2 may enter a meta stable condition where the output may change after a nondeterministic time. Clearly this is disadvantageous.

For a standard synchronous implementation, it is a requirement in the host that the returned data from the target be captured cleanly by the clocking signal. With the arrangement shown in FIG. 2, any transition in the data from the target 4 to the host 2 will arrive back at the host 2 at least two path delay times (i.e. caused by the cabling between the host 2 and the target 4 and the target 4 and the host 2) after the significant clock transition of the clock. These two path delays are also known as the loop delay. In order to address this problem, the clocking frequency of the clock signal has been limited to the inverse of the loop delay. In some implementations, depending on which and how many clock edges are used in a clock cycle, this could lead to a maximum clock frequency of half of the inverse of the loop delay.

Accordingly, it can be appreciated that there is a need for an improved system and method for connecting a host and a target system.

BRIEF SUMMARY OF THE INVENTION

According to a first embodiment of the present invention, there is provided a system comprising a host, a target and connection means therebetween, said host having means for providing a clock signal, first output means for outputting said clock signal to said target via said connection means and second output means for outputting data to said target via said connection means, said data being clocked out by said clock signal, said target having first input means for receiving said clock signal from said host, second input means for receiving said data from said host and first output means for outputting data to said host via said connection means, said host further comprising input means for receiving said data from said target, and oversampling means for oversampling the received data from the target and controlling the clocking in of said data received from said target in dependence on said oversampling.

BRIEF DESCRIPTION OF THE SEVERAL VIEWS OF THE DRAWING(S)

For a better understanding of the present invention and as to how the same may be carried into effect, reference will now be made by way of example only to the accompanying drawings in which.

DETAILED DESCRIPTION OF THE INVENTION

Figure 4:
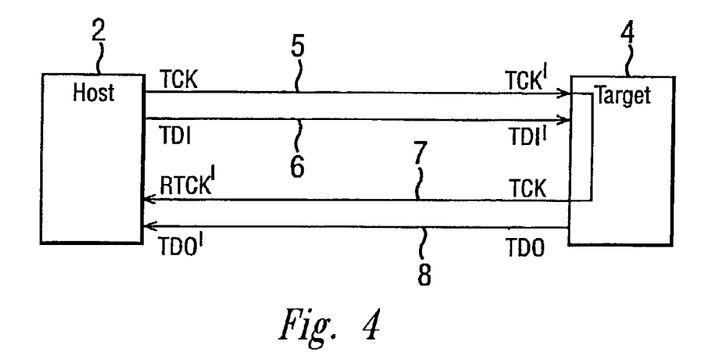
FIG. 4 shows a first proposed modification to the arrangement of FIG. 2.

A first solution to the problem described above is shown in FIG. 4. The arrangement shown in FIG. 4 works in a similar manner to that shown in FIG. 2 except that the clock signal TCK' which is received by the target 4 is then transmitted back to the host 2 via connection 7. The returned clock signal RTCK is used to clock in at the host 2 the data from the target 4. However, this solution is undesirable in that an additional pin connection is required with corresponding cabling. Additional pins are generally undesirable since the use of pins is generally at a premium. A further disadvantage with the arrangement shown in FIG. 4 is that resynchronization between the data from the target 4 and the original clock signal is required in the host 2.

Figure 5:
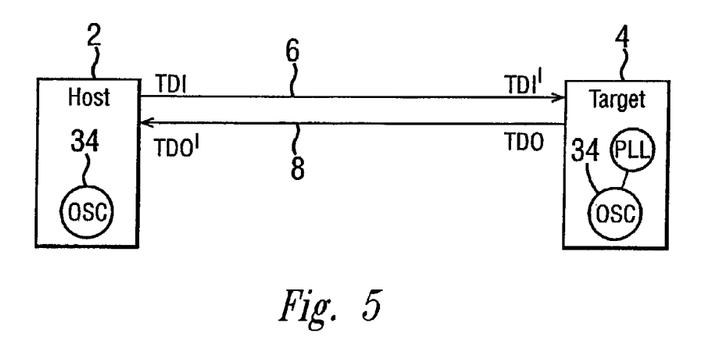
FIG. 5 shows a second proposed modification to the arrangement of FIG. 2.

Another proposed solution to the problem with the arrangement of FIG. 2 is shown in FIG. 5. In this figure, the host 2 and the target 4 each have an oscillator 34. The oscillator 34 at the host is used to control the clocking of the data from the host 2 to the target 4 whilst the oscillator 34 on the target 4 is used to control the clocking of the data from the target 4 to the host 2. Mechanisms such as phase locked loops may be provided in one or other or both of the host 2 or target 4 to try to achieve synchronization. In practice, it is impossible to prevent the oscillators 34 from running at slightly different timing which can cause problems. For example, in a time period T, the host may have N clock cycles whilst the target may have N+1 clock cycles. Where the data from the target 4 is generated in response to the data from the host 2, this is very undesirable.

Figure 6:
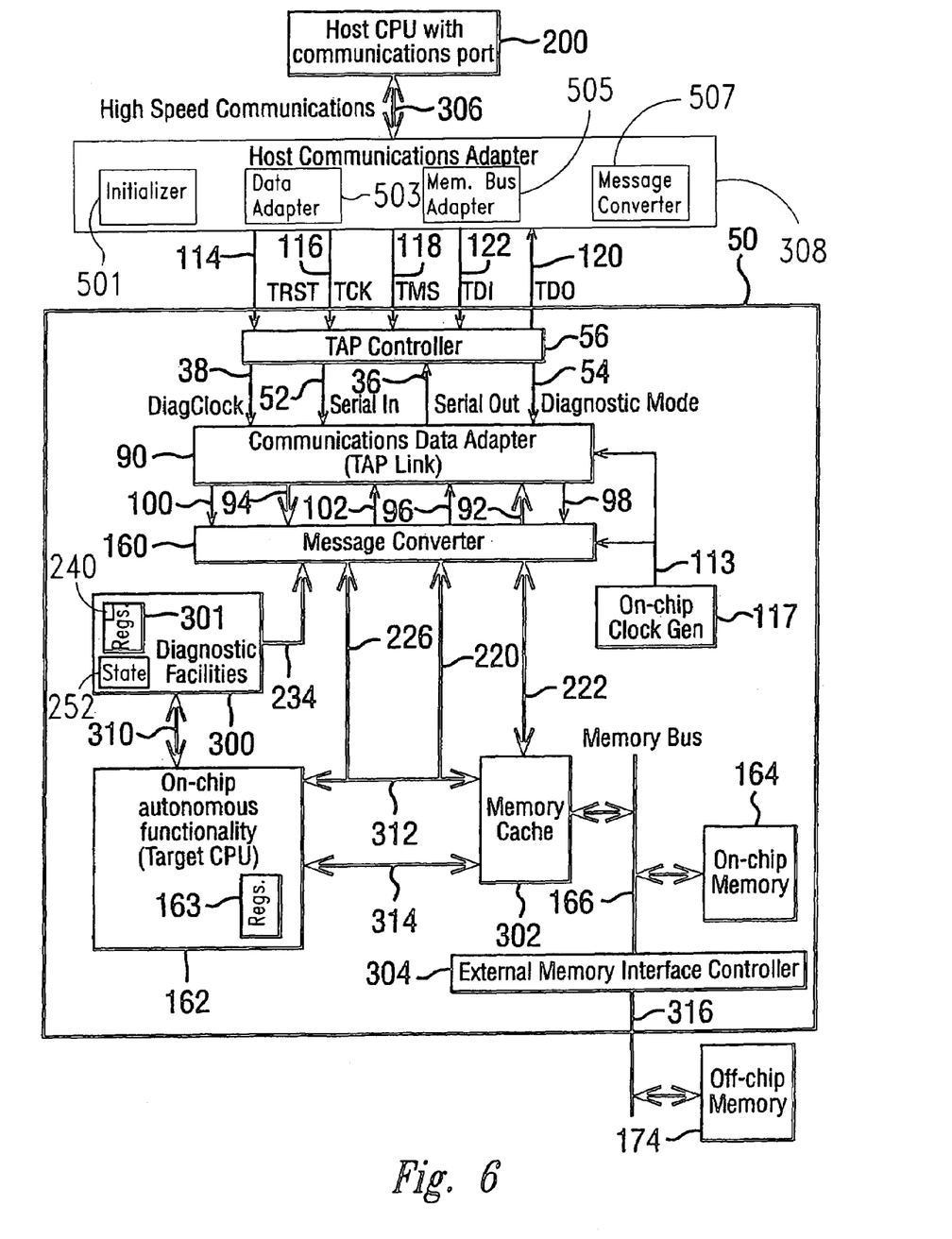
FIG. 6 shows a block diagram illustrating a system environment of an embodiment of the present invention.

A third solution to the problem is illustrated in FIG. 6, which shows, in schematic form, the interconnection between a data adaptor 90 with on-chip destination/source logic such as a target CPU 162, and a host CPU 200. An integrated circuit 50 includes a TAP controller 56, a data adaptor 90, a target CPU 162 including CPU registers 163 and an on-chip memory 164. Additionally, the integrated circuit of FIG. 6 includes diagnostic facilities 300 including diagnostic registers 301, a memory cache 302, an external memory interface controller 304, and a message converter 160. In FIG. 6, it is shown that the host CPU 200 interfaces with the TAP controller 56 of the integrated circuit via a host communications adaptor 308. The host communications adaptor 308 includes a TAP controller initializer 501, a data adaptor 503 and a memory bus adaptor 505. In addition the host communications adaptor 308 includes a message converter 507 equivalent to the message converter 160 provided on the integrated circuit 50 for converting messages to and from the host CPU 200. The host CPU 200 and the host communications adaptor 308 are connected together via bus 306.

It can be seen that the data adaptor 90 communicates with the diagnostic facilities 300, via message converter 160 and the diagnostic bus 234. The diagnostic facilities 300 and target CPU 162 communicate with each other via a bus 310. The memory monitor bus 226 and memory slave bus 220 of the message converter 160 are both connected to a common bus 312 between the target CPU 162 and the memory cache 302. Additionally, the target CPU 162 and memory cache 302 are interconnected via a CPU instruction fetch bus 314. The memory master bus 222 of the message converter 160 is connected to the memory cache 302, which in turn is connected to the memory bus 166 of the on-chip destination/source logic. The memory bus 166 is connected to the on-chip memory 164. Additionally, the memory bus 166 is connected to the external memory interface controller 304, which interfaces the on-chip destination/source logic memory bus 166 to an off-chip memory bus 316 which interfaces with off-chip memory 174.

When the TAP controller 56, one example of which is described in detail in EP-A-0840134 and which is hereby incorporated by reference, is in the diagnostic mode, the structure of FIG. 6 can be used to implement various diagnostic procedures by transmitting messages between the on-chip destination/source logic and the host CPU 200.

The diagnostic bus 234 allows reading from and writing to the diagnostic registers 301 of the diagnostic facilities 300 and also allows triggered events to be read. Control information associated with the target CPU 162 is read from the diagnostic facilities 300. The instruction pointer and other control signals associated with the target CPU are stored in the diagnostic register 301 of the diagnostic facilities 300. The instruction pointer is continually copied into one of the diagnostic registers 301, and can be accessed by a request on the diagnostic bus 234. The status of the target CPU can be determined by looking at one of the diagnostic registers 301 of the diagnostic facilities 300. The diagnostic registers 301 can store various control signals of the target CPU 162, for example STORE, TRAP, TAKE A TRAP, TRAP AT NEXT INSTRUCTION. These signals are communicated to the target CPU 162 via specific wires.

The host CPU 200 may write to registers within the diagnostic facilities 300 via the diagnostic bus 234, in the same manner as the host CPU 200 may write to memory locations within the target CPU 162 memory space via the memory master bus 222 as discussed hereinabove. In response to the host CPU 200 writing to the registers of the diagnostic facilities 300, triggered events may occur. Such triggered events are detected in the message converter 160 by identifying a request signal associated with the reason code identifying the triggered event. In response to the request signal the message converter 160 loads the reason code associated with the triggered event together with the two bits identifying a triggered header byte. The triggered header byte is then output on the transmit data bus TX data to the target CPU 162.

As mentioned previously, the target CPU 162 can access the diagnostic facilities 300 via the memory monitor bus 226 and the diagnostic bus 234. Similarly, if the target CPU 162 writes to the diagnostic facilities 300, and in response to such a write a triggered event occurs, then the message converter 160 will output the triggered header byte contained in the header register 240 back to the target CPU 162. A state machine 252 stores whether a write on the diagnostic bus 234 has been made by the target CPU 162 or the host CPU 200 and returns a triggered event to the correct destination accordingly.

The data adaptor 90 enables serial data received from the TAP controller 56 to be transmitted in the direction of on-chip functional circuitry as parallel data and control signals. Thus, the data adaptor 90 supports a variety of high level diagnostic features, including boot from test access ports, hot plug insertion, and host and target synchronization. Note that the data adaptor 90 is supplied with the DIAG CLK signal on line 38, which is generated off-chip and the SYS-CLK signal on line 113, which is generated on-chip by the clock generator 117.

The message converter 160, an example of which is described in detail in EP-A-0840218, provides for communication between a host CPU and on-chip destination/source logic via a restricted pin count. Such a converter may have access to a variety of on-chip resources. Some of these may be simply monitored, others may be controlled or both monitored and controlled. Monitoring of any resource may be nonintrusive, and thus have no impact on the performance or latency of the functionality of the chip. This is ideal for diagnostic purposes. The message converter 160 performs the functions of interpretation of received message, the compilation of transmit messages, and the selection or direction of information to/from the on-chip destination/source logic. The message converter 160 operates independently of any of the on-chip functionality and is therefore nonintrusive, until or unless it is directed to perform some intrusive operation.

The TAP controller 56 is a synchronous finite state machine, such as one defined by the IEEE standard 1149.1-1990. That IEEE standard defines test logic which can be included in an integrated circuit to provide standardized approaches to testing and interconnections between integrated circuits, testing the integrated circuit itself, and observing or modifying circuit activity during the integrated circuits normal operation.

During normal operation of the integrated circuit 50, the TAP controller 56 is in a reset state, and all of its inputs and outputs are inactive. When a test using the test access port according to a test standard, such as the IEEE standard 1149.1-1990, is to be performed, the test access port controller operates according to the definitions of that standard. In such a test mode the TAP controller 56 should be able to select at least one test mode of operation. One possible test mode is a scan test mode in which scan data is clocked into a scan chain on-chip and/or alternative resultant data is clocked out for checking.

In the described embodiment, the TAP controller 56 can also operate in a diagnostic mode of operation for carrying out diagnostic procedures of source/destination logic on-chip. In the diagnostic mode the TAP controller 56 whilst continuing to provide all normal functionality, additionally acts as a transport agent carrying full duplex, flow controlled, unbounded, serial data, although the TAP controller 56 is unaware that this is the form of the data. Conversely in scan test mode the TAP controller 56 normally handles a single stream of data, without any flow control passing through a selected scan chain. In diagnostic mode, the communication of diagnostic data may include memory access requests from host to target and target to host (reads and writes); status information of CPU registers; data read from host memory or target memory in response to a memory access request; status data for loading into CPU register; and information about memory addresses being accessed by the target CPU. Thus the diagnostic mode may involve nonintrusive monitoring of data, or intrusive loading of data. In the diagnostic mode, the serial data shifted into the test access port is a unidirectional serial data stream which can be encoded in any desired means, for example, the start and stop bits to delineate data chunks. Likewise data shifted out via the test access port is a unidirectional serial data stream which can be encoded in any desired means, for example with start and stop bits to delineate data chunks. Normally the data shifted in and the data shifted out will be encoded in the same way. The input and output unidirectional data streams may be used simultaneously to allow full-duplex, bi-directional serial communications. The sequence of serial data bits could constitute a byte of information.

The data adaptor 90 enables a variety of high level diagnostic features to be supported including boot from test access ports, hot plug insertion and host and target synchronization.

The integrated circuit 50 is connected to the host communications adaptor 308 via five serial connections. In particular, these five serial connections are with the TAP controller 56. The first connection 114 provides a test reset signal. The second connection 116 provides a test clock signal. The third connection 118 provides a test mode signal. The fourth connection 122 provides test data in information. The first four connections are from the host communications adaptor 308 to the TAP controller 56. The test reset signal and the test mode signal together are able to put the TAP controller 56 into various modes. The fifth connection 120 is the test data out connection and is from the TAP controller 56 to the host communications adaptor 308.

The data adaptor 90 receives as inputs from the TAP controller 56 two main signal groups. The first signal group received at this interface represents the TAP controller 56 in diagnostic mode and includes the DIAG.CLOCK signal on line 38, the DIAGMODE signal on line 54, and the DIAGSCANIN signal on line 52. This group includes the output signal DIAGSCANOUT on line 36. In diagnostic mode, the DIAG.CLOCK signal on line 38 is the reference clock signal for the timing of the all signals on the TAP controller interface and has a significant rising edge. This signal corresponds to and maybe directly connected from the incoming clock signal TCK. The DIAGMODE signal on line 54 indicates that the TAP controller 56 is in the diagnostic mode. The DIAGSCANIN signal on line 52 represents serial input data which is valid when the DIAGMODE signal is asserted. The DIAGSCANOUT signal represents serial output data which is valid when the DIAGMODE signal is asserted.

Data adaptor signals at the on-chip interface include a further two groups, namely receive stream data signals and transmit stream data signals. The data adaptor 90 outputs data RX.DATA to on-chip source/destination logic on a receive data bus 94 and receives data TX.DATA from on-chip source/destination logic on a transmit data bus 92. The signals on the interface are synchronous signals. The signals on lines 100 and 102 are the control signals which regulate the flow of data on bus 94. The signals on lines 96 and 98 regulate the flow of data on bus 92. The receive stream data signals associated with the transfer of data RX.DATA on line 94 include the RX.REQUEST signal on line 100 which when asserted indicates that data is valid and a sample is requested to be transferred, the RX.GRANT signal on line 102 which is a "default grant" signal and may be asserted or withdrawn independently of RX.REQUEST.

When RX.GRANT is asserted and if the RX.REQUEST signal is also asserted, the data will be committed for transfer. However, when the RX.GRANT signal is asserted but the RX.REQUEST signal is not asserted, the RX.GRANT signal indicates merely that the on-chip source/destination logic is ready to transmit data.

Figure 7:
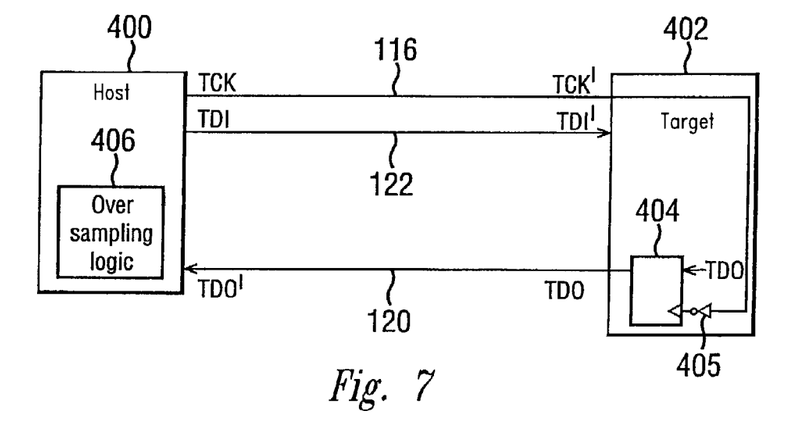
FIG. 7 shows a simplified block diagram illustrating an embodiment of the present invention.

Reference is made to FIG. 7 which schematically illustrates an embodiment of the present invention. The host 400 incorporates the host communications adaptor 308 and host CPU 200 shown in FIG. 6. The target 402 incorporates the integrated circuit 50. For clarity, only three of the five connections between the host and target are shown. The reset signals 114 and test mode signal 118 have been omitted for clarity. The test clock TCK signal is transmitted from the host 400 to the target 402. The test clock TCK signal is used at the host 400 to clock out the test data via connection 122. The test clock TCK' signal received at the target is also used to clock in the test data at the target side 402. The received test clock TCK' signal is input to a flip flop 404 along with a test data out TDO signal. The received test clock TCK' signal is passed through an invertor 405 and used to clock out the test data TDO out via connection 120. The test data out is received at the host with a delay caused by connection 120 and is referred to as TDO'.

The host 400 has over sampling logic 406. As will be described hereinafter, the oversampling logic 406 is used to counter the effects of the delay loop between the host 400 and the target 402, without requiring a reduction in the clock frequency.

In one embodiment, a system for controlling communications between a host and a target comprises: a data input for receiving a data signal; a clock input for receiving a clock signal; and an oversampling circuit for sampling a received data signal and generating a control signal to control processing of the received data signal based at least in part on samples of the received data signal.

Figure 8:
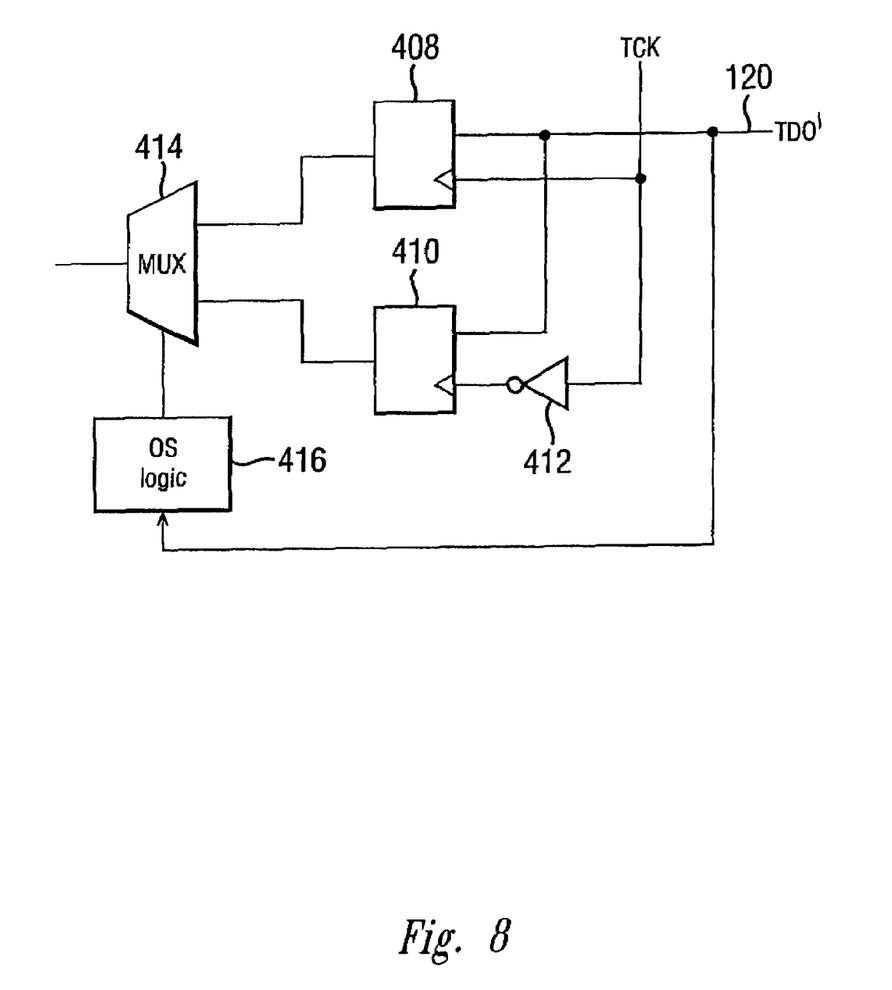
FIG. 8 shows a first embodiment of the host of FIG. 7.

Reference will now be made to FIG. 8 which illustrates the principles behind embodiments of the present invention. The circuitry shown in FIG. 8 is incorporated in the host 400. The test data out TDO' received via the connection 120 is input to first and second flip flops 408 and 410 respectively. The test clock TCK of the host is input as the timing control signal to the first flip flop 408. The test clock TCK is inverted by an inverter 412 and used as the control input to the second flip flop 410. The output of the first and second flip flops 408 and 410 are input to a multiplexer 414 which is controlled by oversampling logic 416. The oversampling logic 416 receives the test data output signal and makes a determination whether or not the test data output is best clocked out by the test clock signal or its inverse. Once the oversampling logic 416 has made its determination, the multiplexer 414 is controlled to select the output of the first flip flop 408 or the second flip flop 410 as its output. The oversampling logic can take any suitable format and examples of this will be described hereinafter.

Figure 9:
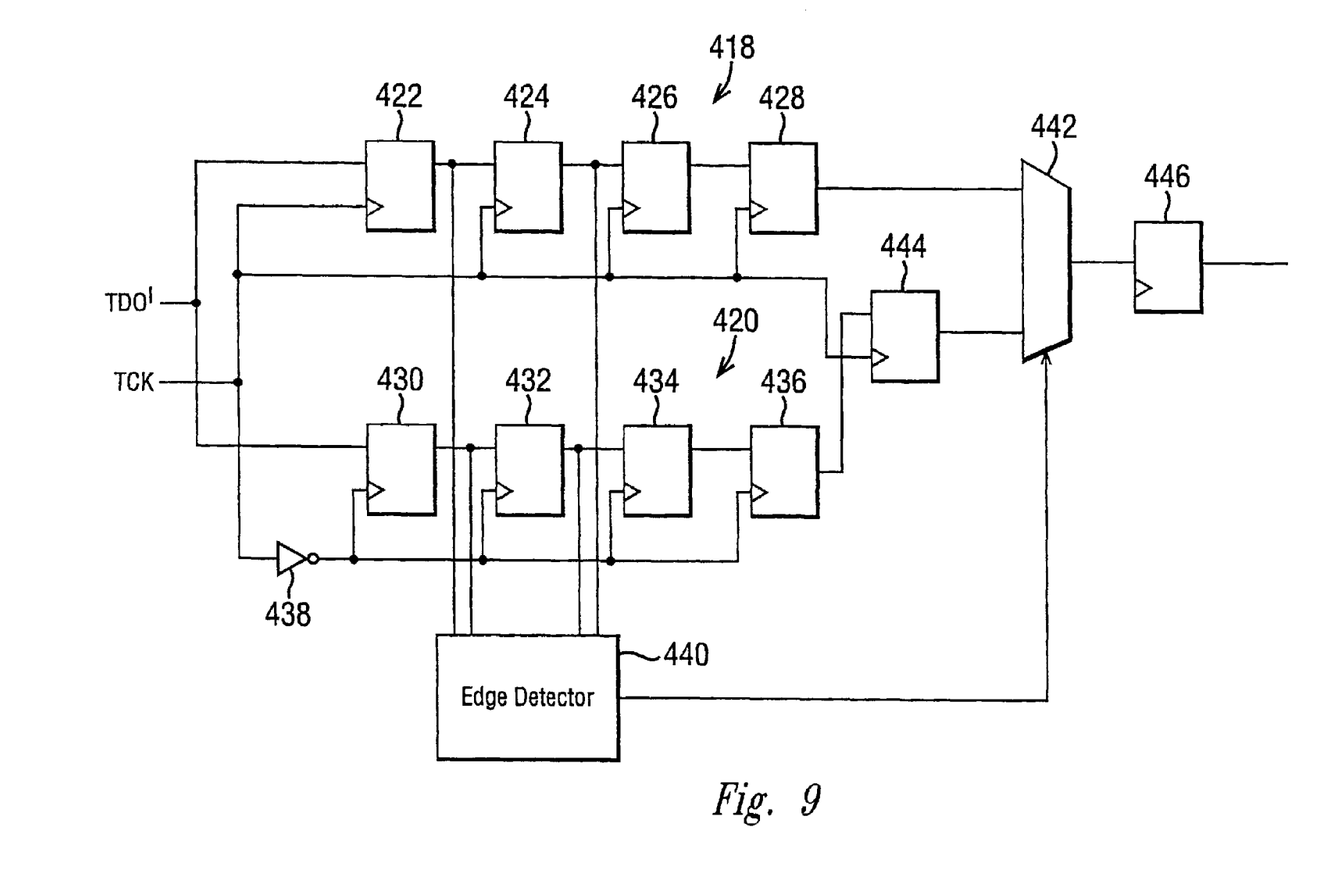
FIG. 9 shows a second embodiment of the host of FIG. 7.

Reference is made to FIG. 9 which uses the same principles as shown in FIG. 8. In FIG. 9 there are two chains of flip flops 418 and 420. The first chain of flip flops comprises four flip flops 422 to 428. The input of the first flip flop-420 422 is provided by the received test data out TDO' signal. The output of the first flip flop 422 provides the input to the second flip flop 424, with the second flip flop 424 output providing the input to the third flip flop 426 and the output of the third flip flop 426 providing the input to the fourth flip flop 428. Each of these flip flops receives the test clock TCK input as its control input.

The second chain of flip flops is constructed in the same way as the first chain of flip flops and also comprises four flip flops 430 to 436. These flip flops receive the inverse of the test clock TCK as their control input. An inverter 438 is provided to generate the inverse of the test clock signal.

An edge detector 440 provides an oversampling logic function. The edge detector looks at the timing of the signal input to the second flip flops 424 and 432 of the respective first and second flip flop chains 418 and 420 from the respective preceding flip flop and the timing of the signal input to the third flip flops 426 and 434 of the respective first and second flip flop chains 418 and 420 from the respective preceding flip flop. It should be appreciated that in alternative embodiments of the present invention, other ones of the flip flops in the chain may be additionally or alternatively considered.

Figure 10:
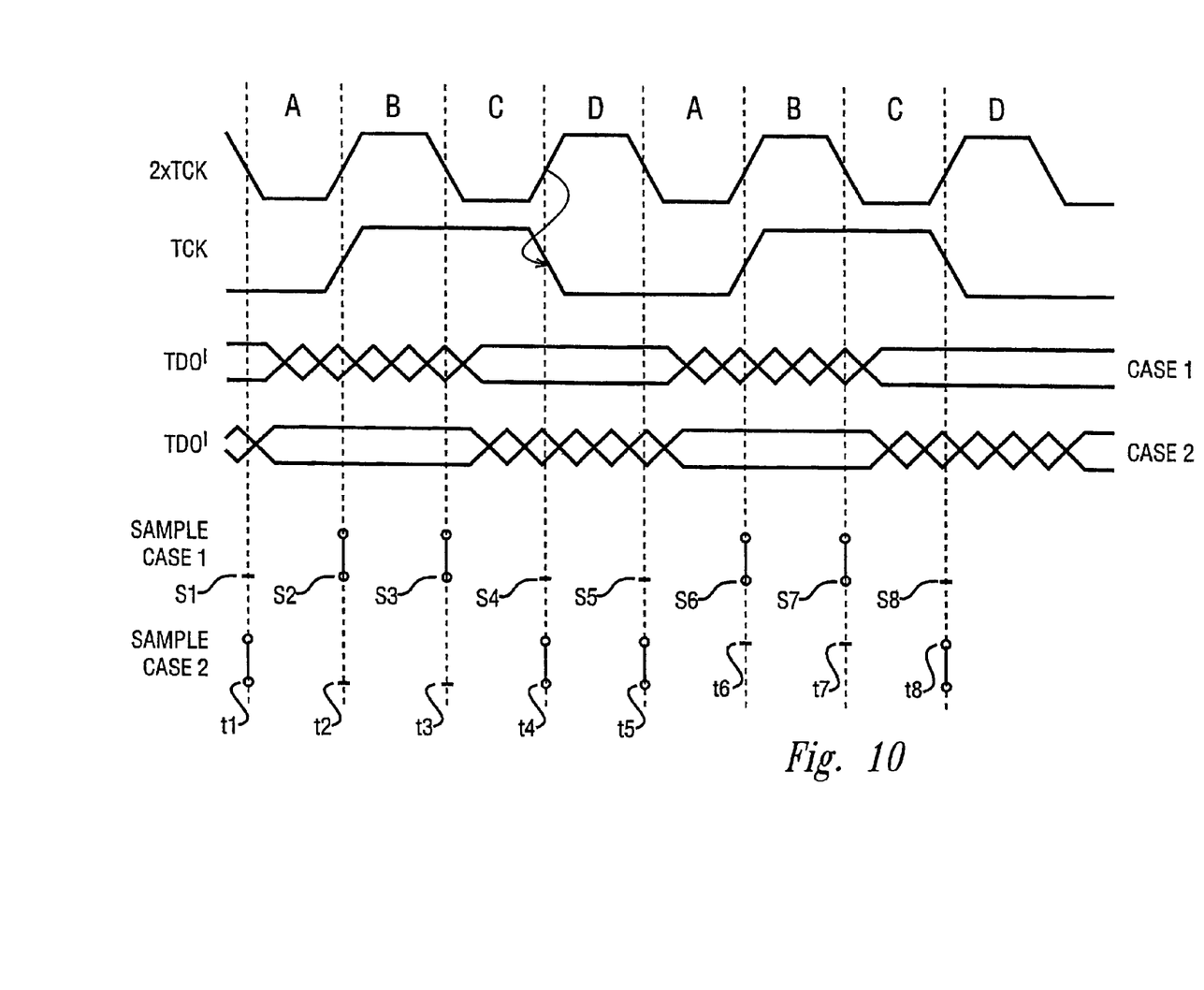
FIG. 10 shows a timing diagram for the arrangement of FIG. 9.

The function of the edge detector 440 will now be explained with reference to FIG. 10. FIG. 10 shows a test clock signal. In order to over sample the test data, a signal 2×TCK having twice the test clock frequency is considered. The test clock signal TCK is synchronized with the double test clock signal 2×TCK in that the rising edges at the beginning of the test clock signal TCK coincides with a rising edge of the double test clock signal 2×TCK. In order to get a four times over sample, the signals are sampled at the rising and falling edges of the double rate test clock signal 2×TCK. In other words, for each cycle of the test clock, four samples are done using the double test clock. The first half of the first clock cycle of the 2×TCK signal is labeled A and the second half B. The first half of the second clock signal is labeled C and the second half D. This corresponds to one cycle of the clock signal TCK. This same notation is used to reference the clock cycles of the 2×TCK signal corresponding to the next clock cycles of the test clock signal TCK.

The test data TDO' received at the host may have a transition sometime within a clock cycle of the test clock signal. Case 1 represents test data which has a transition during one part of a clock cycle and case 2 represents test data which has a transition during another part of the clock cycle. Case 1 can have a transition in a second part of A, in B or the first part of C. Case 2 can have a transition in the second part of C, D or the first part of A. It should be appreciated that the definition of the ranges of case 1 and 2 is a matter of design choice and any other suitable definition can be used.

The oversampling for each of these two cases is illustrated. In the case of the case 1 a first sample si is taken on the falling edge of the 2xTCK signal at the beginning of part A. At this point, it is safe to assume that there is no transition and that the data can be validly read. A second sample s2 taken on the rising edge at the beginning of part B. At this point, there may be a transition and so the data cannot be read with certainty. This is also true for the third sample s3 which is taken on the falling edge at the beginning of part C. The fourth sample s4 taken on the rising edge of part D can be read with certainty as with the first sample. Further samples sn can be taken in a similar manner. It should be appreciated that the number of samples which are taken is a matter of design choice.

The sampling for the second case is illustrated and samples are taken at the same time as for the first sample. For the first and fourth samples t1 and t4, the result cannot be read with certainty whilst for the second and third samples the data can be validly read.

Thus the received data will either have transitions in the range defined by case 1 or by case 2. If the data is in the range defined by case 1, it can be seen that the falling edge of the test clock signal can be used to clock in the data validly as this occurs between parts B and C. If the system requires rising clock edges to clock in data then the inverse of the clock signal can be used. If the data is in the range defined by case 2, then the rising edge of the test clock TCK can be used to clock in data. If the system requires a falling clock edge to clock in data then the inverse of the clock signal TCK can be used.

The procedure carried out by the edge detector determines if the data received TDO' falls into the category defined by the first case or into the category defined by the second case. This also means that the clock signal to be used can be determined. For example some systems may use the clock signal TCK and its inverse. The edge detector will determine which of these clock signals to use.

In alternative embodiments of the invention, the oversampling clock signal may be available for the clocking in of data, in which case the falling edge at the beginning of A or the rising edge at the beginning of D could be used to clock in data if falling into the case 1 category. Likewise the falling edge at the beginning of B or the rising edge at the beginning of C could be used to clock in data if falling into the case 2 category.

It should be appreciated that in alternative embodiments of the present invention, the number of possible cases can be more than two.

Depending on the edges detected by the edge detector 440, the output of the first chain of flip flops 418 is selected if the test clock TCK is more appropriate or the output of the second chain of flip flops 420 is selected if the inverse test clock TCKinv is more appropriate by a multiplexer 442. The multiplexer 442 is controlled by the edge detector to select the output of one or other of the two flip flop chains 418 and 420. It should be appreciated that the output of the second flip flop chain 420 is connected to the input of a further flip flop 444 which receives the test clock signal TCK as an input. This further flip flop 444 is to ensure that the two flip flop chains provide equal delay. The flip flop 444 compensates for the fact that the inverse of the clock signal TCKinv is used to control the second flip flop chain 420.

The output of the multiplexer 442 is input to a further flip flop 446 which provides further timing control.

Figure 11:
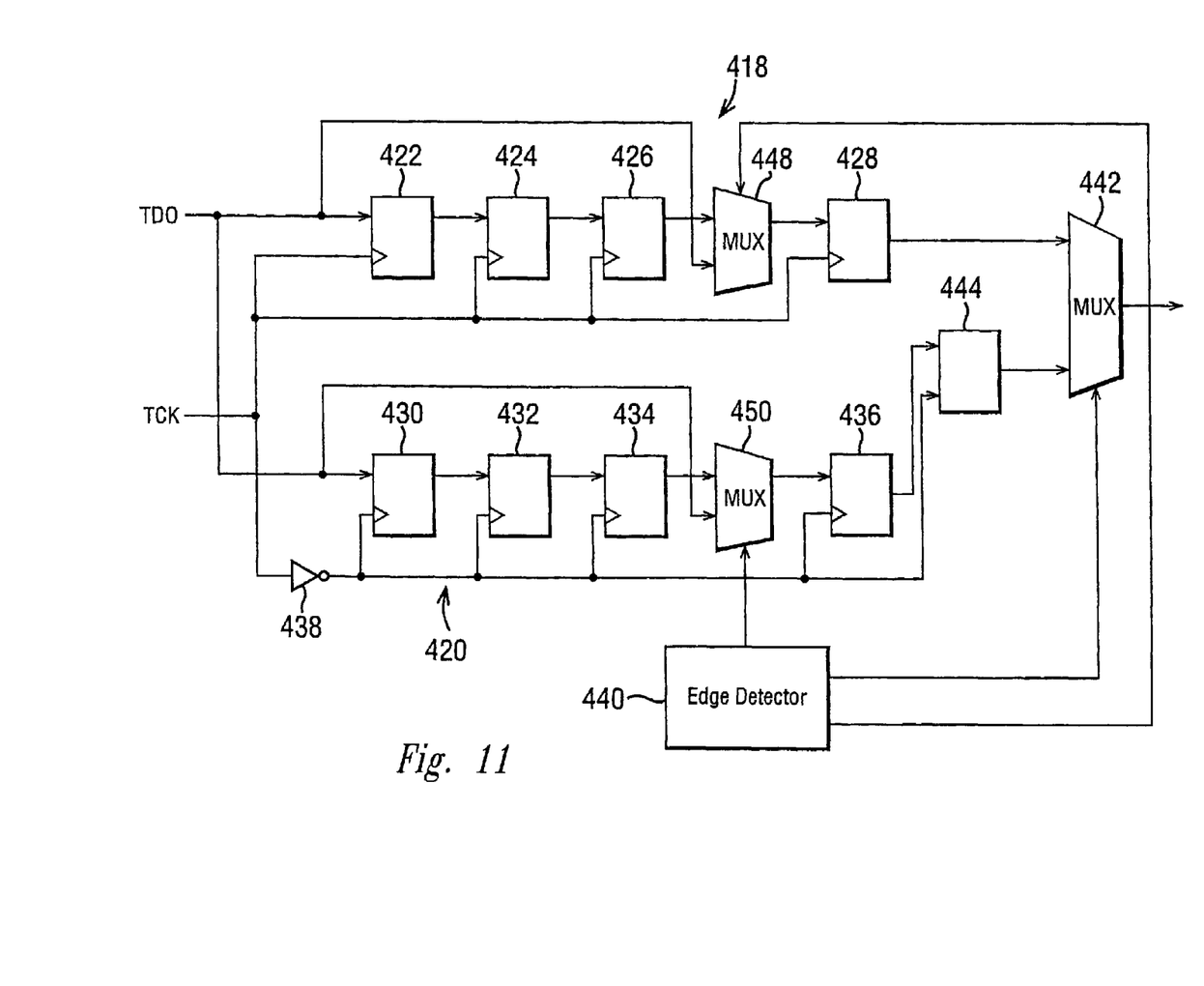
FIG. 11 shows a third embodiment of the host of FIG. 9.

Reference is made to FIG. 11 which shows a modification to the arrangement of FIG. 9. The arrangement of FIG. 11 is arranged to have two modes of operation. During the initial mode of operation, a determination is made as to whether the test data should be clocked out using the test clock signal TCK or its inverse TCKinv. Once it has been established which of the test clock and its inverse should be used, the arrangement enters a stable mode where the flip flop chains are bypassed. Those parts which are the same as shown in FIG. 9 are referenced by like reference numerals and will not be described in more detail.

It should be noted that both the first flip flop chain 418 and the second flip flop 420 chain have a multiplexer 448 and 450 respectively arranged between the third 426 and 434 and fourth 428 and 436 flip flops. It should be appreciated that in alternative embodiments of the present invention, these multiplexers may be arranged at the end of each chain. These multiplexers 448 and 450 receive a first input from the output of the respective third flip flop 426 and 434 and a second input of the test data output directly, which bypasses the first three flip flops of the respective chains. The multiplexers 448 and 450 are controlled by the edge detector 440. The edge detector 440 is also connected to the inputs and outputs respectively of the second flip flops 424, 432 of the respective chains as in FIG. 9 but this has been omitted for clarity. The edge detection 440 works in the same way as described in relation to FIGS. 9 and 10. The multiplexers 448 and 450 are controlled to select the output of the third flip flop during the initial mode when it is being determined whether or not the test data is best clocked out by the clock signal TCK or its inverse TCKinv. Once this determination has been made, the multiplexers 448 and 450 are arranged to output the test data which bypasses the three flip flops. In this way, in the normal mode of operation, unnecessary delay can be avoided. The multiplexers 448 and 450 have their outputs connected to the fourth flip flops 428 and 436 of the respective first and second flip flop chains 418 and 420. The other components of the circuit of FIG. 11 work in a similar way to that described in relation to FIG. 9.

Figure 12:
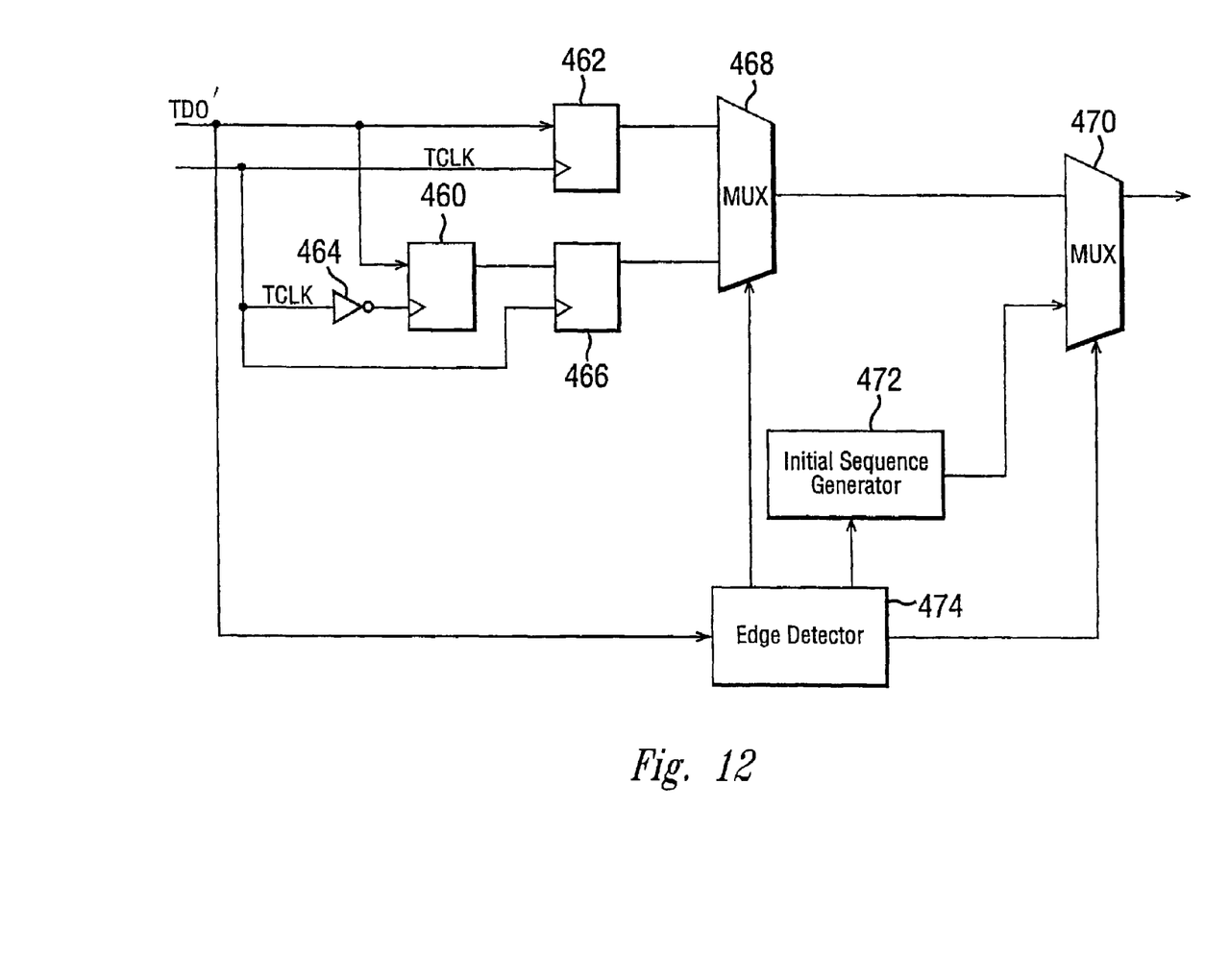
FIG. 12 shows a fourth embodiment of the host of FIG. 7.

FIG. 12 shows a further modification to the arrangement shown in FIG. 9. The arrangement comprises first and second flip flops 460 and 462. The first flip flop 462 receives the test data out TDO' as one input and the test clock signal TCK as another input. The second flip flop 460 receives the test data out TDO' as one input and the inverse of the test clock TCKinv as its second input. An inverter 464 is provided to invert the test clock signal. The second flip flop 460 is arranged in series with a third flip flop 466 which receives the output of the second flip flop 460 as one input and the clock signal TCK as a second input. This provides the same function as flip flop 444 described in relation to FIG. 9. The output of the first and third flip flops 462 and 466 are input to a multiplexer which is controlled by an edge detector 474 in a similar manner to that described in the previous embodiments. The output of the first multiplexer 468 is input to a second multiplexer 470. The second multiplexer 470 has a second input from an initial sequence generator 472. The initial sequence generator 472 is controlled by the edge detector 474. The edge detector 474 analyses the test data signal in order to determine whether it is best clocked out by the test clock TCK or its inverse TCKinv. The edge detector 472 controls the second multiplexer 470 to either output the test data out received from the first multiplexer 468 or the output from the initial sequence generator. The initial sequence generator is arranged to output the test data which is used by the edge detector 472 to determine which clock signal to be used. In this way the initial data is not lost. Once the determination has been made by the edge detector, the edge detector simply controls the second multiplexer to simply output the test data using the appropriate clock signal.

In one embodiment, instead of operating at a higher clock frequency, at least one clock is generated which has the same clock frequency as the test clock frequency but is staggered with respect to the test clock. A plurality of evenly staggered clock signals can be generated in order to determine the most appropriate time to take a sample.

In another alternative embodiment, the data is delayed by a number of steps. In other words, data having no delays is provided as is data having a delay n. The data having no delay or the data with delay n is then output in dependence in what is more appropriate for the test clock. In this way meta stable states can be avoided. More than two sets of data can be generated, each having a different delay.

In one embodiment, a signal having twice the clock frequency is used. It should be appreciated that in alternative embodiments of the present invention, other multiples of the clock frequency can be used.

In another embodiment, the clock or its inverse is selected. In alternative embodiments of the invention more than two options will be available. A separate flip flop chain may be provided for each option.

Embodiments have been described in the context of an arrangement in which the host and target exchange test data. The described embodiments may be used with any other type of data.

The described embodiments have the advantage that no additional wires are required between the host and target. No changes to the on chip logic are required. Variations in the generation of the frequency of the clock signals at the host and target are avoided.

The described embodiments allow first order effects to be eliminated. First order effects are caused by the presence of the wire or any other type of connection. It should be appreciated that second order causes of variation in delay such as temperature change slowly. Accordingly, there is no need to continuously track for the best sample point which would impose bandwidth overhead. Occasional tracking is sufficient.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims (and equivalents thereof).

The invention claimed is:

1. A system comprising:
a host, a target and connection means therebetween, said host having means for providing a test clock signal, first output means for outputting said test clock signal to said target via said connection means and second output means for outputting data to said target via said connection means, said data being clocked out by said test clock signal, said target having first input means for receiving said test clock signal from said host, second input means for receiving said data from said host and first output means for outputting data to said host via said connection means, said target is arranged to clock out data to said host over said first output means using said received test clock signal, said host further comprising input means for receiving said data from said target, and oversampling means for oversampling the received data from the target and generating a control signal to control clocking in of the data received from the target by the host based on samples of the received data from the target, the oversampling means being coupled to the means for providing the test clock signal.

2. The system of claim 1, wherein said oversampling takes place at time intervals derived from the test clock signal.

3. The system of claim 1, wherein the oversampling means comprising means for providing a plurality of samples of the data received from said target with said plurality of samples delayed by different time intervals.

4. The system of claim 1, wherein the oversampling means is arranged to select one of the test clock signal and its inverse to control the clocking in of said data received from said target.

5. The system of claim 1, wherein said oversampling means is arranged to generate a clock signal having a frequency which is greater than that of the test clock signal, said data received from said target being oversampled in accordance with the generated clock signal.

6. The system of claim 5, wherein the frequency of the generated clock signal is twice that of the test clock signal.

7. The system of claim 1, wherein said oversampling means is arranged to provide at least one copy of said data received from said target, said at least one copy being delayed with respect to said data received from said target, said oversampling means selecting one of said data received from said target and said at least one copy of said data received from said target to be clocked in.

8. The system of claim 7, wherein said selected data is clocked in using said test clock signal.

9. The system of claim 1, wherein said host has a first mode of operation and a second mode of operation, in said first mode of operation said oversampling means is arranged to determine how said data received from said target should be clocked in and wherein in said second mode of operation the data received from said target is clocked in as determined in the first mode.

10. The system of claim 9, wherein in said second mode, said received data bypasses at least a portion of said oversampling means.

11. The system of claim 9 wherein in the second mode, the received data selectively bypasses at least a portion of the oversampling means.

12. The system of claim 1, wherein said oversampling means comprises a plurality of data paths for the data received from the target.

13. The system of claim 12, wherein said data paths comprise a plurality of flip-flops.

14. The system of claim 1, wherein said data from said host is clocked in at said target by said received test clock signal.

15. The system of claim 1, wherein at least one of said target and host comprises an integrated circuit.

16. The system of claim 1, wherein at least one of said data output by said target and said data output by said host comprises test data.

17. A system for controlling communications between a host and a target, the system comprising:
an input for receiving a first signal from the target;
a clock input for receiving a clock signal from the host, the host being configured to transmit the clock signal to the target; and
an oversampling circuit for sampling the received first signal and, based at least in part on samples of the received first signal, generating a control signal to control the clocking in of the received first signal using the clock signal.

18. The system of claim 17 wherein the oversampling circuit comprises an edge detecting circuit for detecting transition edges of the received first signal.

19. The system of claim 18 wherein the oversampling circuit further comprises a plurality of chains of flip-flops and a multiplexer for processing the received first signal.

20. The system of claim 17 wherein the first signal is a data signal.

21. The system of claim 17 wherein the system has a first mode of operation and a second mode of operation, in the first mode of operation the oversampling circuit is arranged to determine how the received first signal should be clocked in and in the second mode of operation the received first signal is clocked in as determined in the first mode.

22. The system of claim 21 wherein in the second mode, the received first signal selectively bypasses at least a portion of the oversampling circuit.

23. A host having a system for communicating with a target, the system comprising:
a clock;
a clock output to send a clock signal from the clock to the target;
an input to receive a signal from the target; and
an oversampling circuit to sample the signal received from the target and generate a control signal based at least in part on samples of the received signal, the control signal controlling the clocking in of the received signal by the host using the clock signal.

24. The system of claim 23 wherein the oversampling circuit is configured to select one of the clock signal and its inverse to control the clocking in of the signal received from the target.

25. The system of claim 23 wherein the signal received from the target is a data signal.

26. The host of claim 23 wherein the host has a first mode of operation and a second mode of operation, in the first mode of operation the oversampling circuit is arranged to determine how the received signal should be clocked in and in the second mode of operation the received signal is clocked in as determined in the first mode.

27. The host of claim 26 wherein in the second mode the received first signal selectively bypasses at least a portion of the oversampling circuit.

28. A method of controlling communications between a host and a target, the method comprising:
   outputting a clock signal from the host to the target;
   sampling a received signal from the target;
   comparing samples of the received signal to the clock signal; and
   generating a control signal based at least in part on the comparison of the samples of the received signal to the clock signal, the control signal controlling the clocking in of the received signal by the host.

29. The method of claim 28 wherein the step of comparing samples of the received signal to the clock signal comprises detecting transition edges of the received signal.

30. The method of claim 28 wherein the received signal is a data signal.

31. The method of claim 28, further comprising selectively bypassing a portion of sampling circuit in response to the control signal.

32. A system, comprising:
   a host clock configured to produce a clock signal;
   a first host node coupled to the clock signal and configured to couple to a target;
   a second host node configured to couple to the target; and
   a host sampler coupled to the clock signal and the second host node and configured to over-sample a signal received at the second host node and to control clocking in of the received signal based on samples of the received signal.

33. The system of claim 32 wherein the host sampler is configured to select one of the clock signal and its inverse to control the clocking in of the received signal.

34. The system of claim 32 wherein the first and second host nodes comprise pins on an integrated circuit.

35. The system of claim 32 wherein the target comprises a first target node; and a second target node; and the system further comprises:
   a communications link configured to couple the first host node to the first target node for supplying the clock signal to the target and to couple the second target node to the second host node for transmission of the received signal from the target to the host.

36. The system of claim 35 wherein the host further comprises a third host node, the target further comprises a third target node, and the communications link is configured to couple the third host node to the third target node for transmission of a test signal from the host to the target.

37. The system of claim 32 wherein the system has a first mode of operation and a second mode of operation, in the first mode of operation the host sampler is arranged to determine how the received signal should be clocked in and in the second mode of operation the received signal is clocked in as determined in the first mode.

38. The system of claim 37 wherein in the second mode, the received signal selectively bypasses at least a portion of the host sampler.

* * * * *

UNITED STATES PATENT AND TRADEMARK OFFICE
CERTIFICATE OF CORRECTION

PATENT NO. : 7,489,724 B2
APPLICATION NO. : 10/247263
DATED : February 10, 2009
INVENTOR(S) : Robert Geoffrey Warren

It is certified that error appears in the above-identified patent and that said Letters Patent is hereby corrected as shown below:

<u>Column 11</u>
Lines 34-35, "wherein the oversampling means comprising means for providing a plurality of samples of the" should read as -- wherein the oversampling means comprises means for providing a plurality of samples of the --

<u>Column 13</u>
Line 20, "bypassing a portion of sampling circuit in response to the" should read as -- bypassing a portion of a sampling circuit in response to the --

Signed and Sealed this

Seventh Day of July, 2009

JOHN DOLL
*Acting Director of the United States Patent and Trademark Office*